United States Patent
Glazunov et al.

(10) Patent No.: US 9,825,212 B2
(45) Date of Patent: Nov. 21, 2017

(54) METHOD FOR PRODUCING A PIEZOELECTRIC MULTILAYER COMPONENT AND A PIEZOELECTRIC MULTILAYER COMPONENT

(71) Applicant: EPCOS AG, Munich (DE)

(72) Inventors: Alexander Glazunov, Deutschlandsberg (AT); Oliver Dernovsek, Lieboch (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 15/132,805

(22) Filed: Apr. 19, 2016

(65) Prior Publication Data

US 2016/0233409 A1    Aug. 11, 2016

Related U.S. Application Data

(62) Division of application No. 13/510,888, filed as application No. PCT/EP2011/050847 on Jan. 21, 2011, now Pat. No. 9,343,652.

(30) Foreign Application Priority Data

Jan. 22, 2010 (DE) ........................ 10 2010 005 403

(51) Int. Cl.
| | |
|---|---|
| H01L 41/08 | (2006.01) |
| H01L 41/083 | (2006.01) |
| H01L 41/047 | (2006.01) |
| H01L 41/187 | (2006.01) |
| H01L 41/273 | (2013.01) |
| H01L 41/297 | (2013.01) |

(52) U.S. Cl.
CPC ...... *H01L 41/0838* (2013.01); *H01L 41/0471* (2013.01); *H01L 41/0805* (2013.01); *H01L 41/1876* (2013.01); *H01L 41/273* (2013.01); *H01L 41/297* (2013.01)

(58) Field of Classification Search
CPC . H01L 41/08; H01L 41/0477; H01L 41/0838; H01L 41/1876; H01L 41/0471
USPC ....... 310/358, 363, 366, 328, 311, 365, 364; 29/25.35; 252/62.9, 62
See application file for complete search history.

(56) References Cited

U.S. PATENT DOCUMENTS

| | | | | |
|---|---|---|---|---|
| 4,956,744 | A * | 9/1990 | Berghout | H01G 4/008 361/321.3 |
| 6,230,378 | B1 * | 5/2001 | Cramer | H01L 41/083 310/800 |
| 7,063,813 | B1 | 6/2006 | Nagaya et al. | |
| 7,208,862 | B2 | 4/2007 | Florian et al. | |
| 7,358,655 | B2 | 4/2008 | Ragossnig et al. | |

(Continued)

FOREIGN PATENT DOCUMENTS

| | | |
|---|---|---|
| CN | 1774822 A | 5/2006 |
| DE | 68912365 T2 | 7/1994 |

(Continued)

*Primary Examiner* — Thomas Dougherty
*Assistant Examiner* — Karen B Addison
(74) *Attorney, Agent, or Firm* — Slater Matsil, LLP

(57) ABSTRACT

A piezoelectric multilayer component having a stack of sintered piezoelectric layers and inner electrodes arranged between the piezoelectric layers. A region which has poling cracks is present on the surface of at least one electrode, and the poling cracks are separated from a surface of at least one of the inner electrodes by the region having the poling cracks.

4 Claims, 4 Drawing Sheets

(56) References Cited

U.S. PATENT DOCUMENTS

| | | | |
|---|---|---|---|
| 7,420,319 B2* | 9/2008 | Kastl | H01L 41/0471 310/328 |
| 7,449,077 B2 | 11/2008 | Heinzmann et al. | |
| 7,795,789 B2* | 9/2010 | Schuh | H01L 41/0471 310/328 |
| 2006/0181178 A1 | 8/2006 | Kastl et al. | |
| 2006/0211217 A1 | 9/2006 | Xu et al. | |
| 2007/0209173 A1 | 9/2007 | Hira et al. | |
| 2007/0269667 A1 | 11/2007 | Kobayashi et al. | |
| 2007/0273251 A1 | 11/2007 | Okamura et al. | |
| 2009/0015109 A1 | 1/2009 | Schuh | |
| 2010/0141098 A1 | 6/2010 | Doellgast et al. | |

FOREIGN PATENT DOCUMENTS

| | | |
|---|---|---|
| DE | 19615695 C1 | 7/1997 |
| DE | 10258444 A1 | 7/2003 |
| DE | 10201641 A1 | 8/2003 |
| DE | 10234787 C | 10/2003 |
| DE | 10307825 A | 9/2004 |
| DE | 102007037500 A | 11/2008 |
| JP | H0612910 A | 1/1994 |
| JP | 2005191049 A | 7/2005 |
| JP | 2006108546 A | 4/2006 |
| JP | 2007180387 A | 7/2007 |
| JP | 2008535228 A | 8/2008 |
| JP | 2009182311 A | 8/2009 |
| WO | 2006000479 A1 | 1/2006 |
| WO | 2006087871 A1 | 8/2006 |
| WO | 2006103154 A1 | 10/2006 |
| WO | 2009092585 A1 | 7/2009 |

* cited by examiner

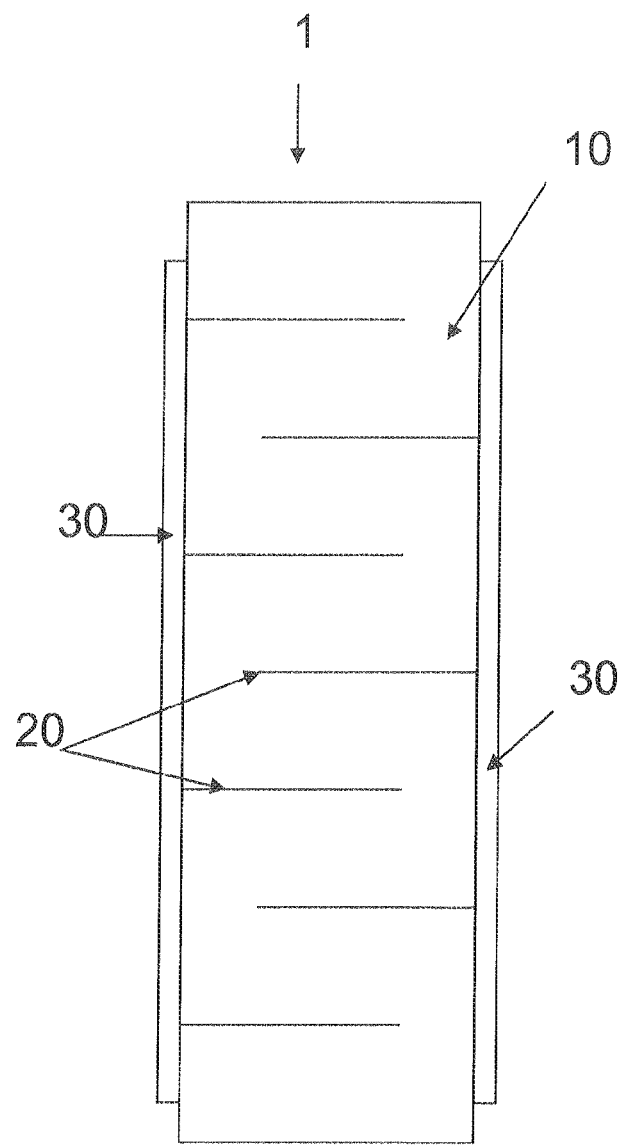

METHOD FOR PRODUCING A PIEZOELECTRIC MULTILAYER COMPONENT AND A PIEZOELECTRIC MULTILAYER COMPONENT

This patent application is a divisional of U.S. patent application Ser. No. 13/510,888 filed on Jul. 31, 2012 titled "Method for Producing a Piezoelectric Multilayer Component and a Piezoelectric Multilayer Component," which is a national phase filing under section 371 of PCT/EP2011/050847, filed Jan. 21, 2011, which claims the priority of German patent application no. 10 2010 005 403.8, filed Jan. 22, 2010, each of which is incorporated herein by reference in its entirety.

TECHNICAL FIELD

A method for producing a piezoelectric multilayer component is provided, in which a stack of piezoelectric green films and layers of electrode material is formed and sintered.

SUMMARY

A piezoelectric multilayer component comprising a stack of sintered piezoelectric layers and inner electrodes arranged between them is furthermore provided. Such a multilayer component is, for example, a piezo actuator, which can be used to operate an injection valve in a motor vehicle.

The reliability of piezoelectric multilayer components depends on the control over cracks possibly occurring during their production. Such cracks may, for example, occur during thermal processes such as sintering, metallization and soldering or during the polarization, since elastic stresses are formed owing to different expansions in various regions of the component. Such so-called relaxation cracks or poling cracks may furthermore change direction, extend perpendicularly to the electrodes and therefore for example bridge two electrodes, which leads to a short circuit and failure of the component.

In one aspect, the present invention provides a method for producing a piezoelectric multilayer component which has increased reliability. In another aspect, the present invention provides a piezoelectric multilayer component having increased reliability. This object is achieved by a multilayer component.

A method for producing a piezoelectric multilayer component is provided, which comprises the steps:

A) providing piezoelectric green films containing a piezoelectric material,
B) providing an electrode material containing Pd,
C) alternately arranging green films and layers of electrode material in order to form a stack, and
D) sintering the stack.

At least one layer of electrode material is provided with a coating which contains PbO in method step C) and/or PbO is mixed with the electrode material in method step B).

With this method, a piezoelectric multilayer component is produced which comprises piezoelectric ceramic layers with inner electrodes arranged between them.

The piezoelectric green films may comprise a material which can be sintered to form lead zirconate titanate (PZT) ceramic.

"Alternately arranging" may also mean that a layer of electrode material is not applied on every green film. For example, some piezoelectric green films may be arranged above one another without there being any layers of electrode material between them.

The layers of electrode material form the inner electrodes in the finished multilayer component, and they may be applied onto the green films as a metal paste by means of a screen printing method.

The electrode material, which contains Pd and may be a metal paste, may comprise a mixture or an alloy of Ag and Pd or of Cu and Pd. Other mixtures and alloys containing Pd may likewise be envisaged. Furthermore, the electrode material may also be a metal paste containing Pd, into which PbO is added in a uniformly distributed way.

The coating containing PbO, which is applied onto the layer of electrode material in method step C), may furthermore be applied onto the electrode material by means of screen printing.

The stack formed in method step C) is subsequently compressed and then the green films and the layers of electrode material are sintered together in method step D), so that a multilayer component consisting of piezoelectric layers with inner electrodes arranged between them is formed.

Method step D) may furthermore comprise the substeps:
D1) sintering at a temperature of up to 400° C.,
D2) sintering at a temperature which lies in a range of from 400° C. to 700° C.,
D3) sintering at a temperature of more than 700° C., an intermediate phase containing $PbPdO_2$ being formed between the electrode material and the piezoelectric material in substep D2).

The temperature in substep D3) may, for example, be up to 1200° C. During the sintering, reactions take place between the PbO, which is contained in the coating and/or in the electrode material, and the Pd which is contained in the electrode material, in which case the $PbPdO_2$ is formed. The intermediate phase containing $PbPdO_2$ may thus, for example, be formed where the coating of PbO was applied on the electrode material. An intermediate phase consisting of $PbPdO_2$ may thus be formed, which is present between the piezoelectric material and the electrode material, while the coating which contains PbO is substantially decomposed. The intermediate phase may, for example, have a thickness of less than 1 μm.

The reactions which take place in method step D) may be described as follows:

PdO in substep D1) is formed by the sintering gas atmosphere, with the Pd diffusing out of the electrode material:

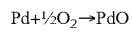
$$Pd + \tfrac{1}{2}O_2 \rightarrow PdO$$

In the subsequent substep D2), the $PbPdO_2$ intermediate phase is formed from the PdO together with the PbO present in the coating and/or in the electrode material. The coating is substantially decomposed during this:

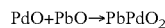
$$PdO + PbO \rightarrow PbPdO_2$$

Lastly, the $PbPdO_2$ may be at least partially decomposed into Pd and PbO in substep D3):

$$PbPdO_2 \rightarrow PbO + Pd + \tfrac{1}{2}O_2$$

The metallic Pd may in this case diffuse back into the electrode material. The free PbO may at least partially escape into the atmosphere or remain in the piezoelectric material or electrode material.

The $PbPdO_2$ formed in substep D2) may have a larger volume than PbO and than the piezoelectric material. Owing to the volume change occurring between the substeps, a stress increase may occur in the region between the electrode material and the piezoelectric material, which may lead to small cracks, so-called microcracks. These occur where the reaction between PbO and Pd has taken place, that is to say in the region in which the coating was present on the electrode material before the sintering, i.e. between the electrode material and the piezoelectric material.

During operation of the multilayer component or its polarization, these microcracks may open to form relaxation cracks or poling cracks. Since the coating containing PbO on the electrode material limits the region in which microcracks can form to the region which is directly adjacent to the inner electrodes of the finished multilayer component, the poling and/or relaxation cracks can likewise be restricted to this region. The region which is directly adjacent to the inner electrodes of the finished multilayer component, and to which the formation of the microcracks is restricted, is also produced when only the electrode material contains PbO since in this case as well $PbPdO_2$ is formed only in this region. The formation and the profile of poling and/or relaxation cracks are therefore deliberately dictated, so that uncontrolled growth and branching of these cracks transversely to the inner electrodes can be reduced or prevented.

In this method, PbO with which the Pd from the electrode material reacts to form $PbPdO_2$ is distributed homogeneously on the surface of the electrode material. In addition or as an alternative, it may also be mixed with the electrode material so that it is also distributed homogeneously in the electrode material. The effect achievable by this is that the $PbPdO_2$ intermediate phase is formed uniformly on the surface of the electrode material, between the electrode material and the piezoelectric material.

The result of this is that an intermediate phase, which has a different chemical composition to the piezoelectric material and therefore also a different mechanical strength and different elastic properties, is formed uniformly on the surface of the electrode material, between the electrode material and the piezoelectric material. The thermal expansion coefficients of this intermediate phase and of the piezoelectric material may also be different. The formation of microcracks in precisely this limited region of the intermediate phase is thus promoted when, in substep D3), the sintering process is lengthened and finally concluded. In order to ensure the controlled formation of microcracks in the limited region, substep D2) may be carried out for a longer period of time compared with substeps D1) and D3).

In the finished multilayer component, there is then a region weakened by microcracks on at least one inner electrode, in which for example poling cracks that are restricted to this region can be formed during the polarization. The crack growth may therefore deliberately be constrained parallel to the inner electrodes.

Such poling cracks may be formed in a method step E) which follows method step D) and in which the sintered stack is poled.

To this end, after the sintering, outer electrodes are applied on the stack and the piezoelectric layers which have been formed from the piezoelectric green films during the sintering are polarized.

In this case, for example, a DC voltage is applied between neighboring inner electrodes and the stack is heated. In so-called inactive zones in which neighboring inner electrodes of different polarity do not overlap in the stack direction, the piezoelectric material does not expand or expands less than in the active zones in which overlap takes place. Owing to the different expansion of the piezoelectric layers in inactive and active zones, mechanical stresses are formed which can lead to the cracks during the polarization.

Poling cracks can therefore be formed in method step E). These are formed in the region in which microcracks are already present. The poling cracks can be formed from these microcracks. The poling cracks therefore extend parallel to the inner electrodes in the region in which the $PbPdO_2$ intermediate phase was present during the sintering.

This method thus has the effect that the formation of a $PbPdO_2$ intermediate phase can become more efficient. Inner electrodes with or without a coating containing PbO may in this case have a thickness of from 3 to 5 μm, and the layers of piezoelectric material may have a thickness of from 30 to 100 μm. Owing to this thickness difference, all of the PbO from the electrode material if it was mixed therewith, or from its coating, can be used for the reaction with the Pd and the deliberate formation of the intermediate phase between the electrode material and the piezoelectric material in the method.

The formation of the intermediate phase can in this case be less dependent on the temperature profile and/or oxygen partial pressure during the sintering in method step D), since PbO is available in excess for the formation of the intermediate phase.

The costs for this method can be further reduced by reducing the Pd content in the electrode material. The intermediate phase becomes thinner when less Pd is available for the reaction with PbO, so that fewer microcracks restricted to the region of the intermediate phase are also formed, which in turn leads to fewer relaxation and/or poling cracks.

A piezoelectric multilayer component is furthermore provided, which comprises a stack of sintered piezoelectric layers and inner electrodes arranged between them, wherein a region which comprises poling cracks is present on the surface of at least one electrode.

This region may be present on the entire surface of the at least one inner electrode so that the poling cracks extend parallel to the inner electrode.

An increased PbO content compared with the piezoelectric layers, and/or traces of $PbPdO_2$, may furthermore be present in this region.

A "piezoelectric layer" refers to a section of the stack which comprises a piezoelectric material and is bounded in the stack direction by two neighboring inner electrodes. A piezoelectric layer is formed from one or more piezoelectric sheets, which are arranged above one another along the stack direction. For example, a piezoelectric sheet may result from a piezoelectric green film. A piezoelectric layer may also comprise only a single piezoelectric sheet.

The inner electrode may comprise a material which contains Pd. The material may be selected from a group which comprises mixtures and alloys of Ag and Pd or Cu and Pd.

The piezoelectric layers may comprise a ceramic which contains lead zirconate titanate.

Preferably, outer electrodes are applied onto two opposite outer faces of the component. An outer electrode comprises, for example, a base metallization burnt in on the stack. The inner electrodes are preferably connected alternately to the outer electrodes along the stack direction of the component. To this end, the inner electrodes are, for example, led alternately up to one of the outer electrodes and have a spacing from the second outer electrode. In this way, the inner electrodes of the same polarity are electrically connected to one another via a common outer electrode.

The poling cracks may be substantially free of branching. A multilayer component which has a high reliability is thereby provided. Owing to their spatial arrangement, the poling cracks which are substantially free of branching and extend parallel to the at least one inner electrode cannot lead to a short circuit of the component, since they cannot bridge a plurality of inner electrodes.

BRIEF DESCRIPTION OF THE DRAWINGS

The specified method and the specified multilayer component and their advantageous configurations will be explained below with the aid of schematic figures, which are not true to scale, and with the aid of exemplary embodiments.

FIG. 1 shows the schematic side view of the multilayer component;

DETAILED DESCRIPTION OF ILLUSTRATIVE EMBODIMENTS

Figure 2A:
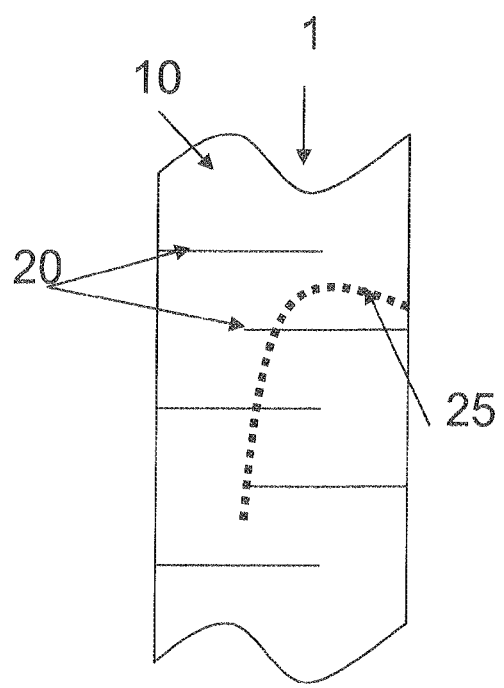
FIG. 2a shows an enlarged detail of the schematic side view of the multilayer component.

FIG. 1 shows a schematic side view of a piezoelectric multilayer component in the form of a piezo actuator. The component comprises a stack 1 of piezoelectric layers 10 arranged above one another and inner electrodes 20 lying between them. The inner electrodes 20 are formed as electrode layers. The piezoelectric layers 10 and the inner electrodes 20 are arranged above one another.

The piezoelectric layers 10 contain a ceramic material, for example lead zirconate titanate (PZT) or a lead-free ceramic. The ceramic material may also contain dopants. The inner electrodes 20 contain, for example, a mixture or an alloy of Ag and Pd or Cu and Pd. The Pd has a proportion by weight of up to 40% in the electrode material.

In order to produce the stack 1, for example, green films which contain a ceramic powder, an organic binder and a solvent are produced by film drawing or film casting. On some of the green films, an electrode paste is applied by means of screen printing in order to form the inner electrodes 20. The green films are stacked above one another along a length direction and compressed. The intermediate products of the components are separated in the desired shape from the film stack. Lastly, the stack of piezoelectric green films and electrode layers is sintered.

Outer electrodes 30, which are also shown in FIG. 1, are furthermore applied after the sintering.

In the embodiment shown here, the outer electrodes 30 are arranged on opposite side faces of the stack 1 and extend in the form of strips along the stack direction. The outer electrodes 30 contain, for example, Ag or Cu and may be applied onto the stack 1 as a metal paste and burnt in.

Alternately along the stack direction, the inner electrodes 20 are led up to one of the outer electrodes 30 and separated from the second outer electrode 30. In this way, the outer electrodes 30 are electrically connected to the inner electrodes 20 alternately along the stack direction. In order to produce the electrical connection, a connection element (not shown here) may be applied onto the outer electrodes 30, for example by soldering.

FIG. 2a shows an enlarged detail of the schematic side view of the multilayer component.

The component expands in the length direction when a voltage is applied between the outer electrodes 30. In a so-called active zone, in which neighboring inner electrodes 20 overlap in the stack direction, an electric field is set up when a voltage is applied to the outer electrodes 30, so that the piezoelectric layers 10 expand in the length direction. In inactive zones, in which neighboring electrode layers 20 do not overlap, the piezo actuator expands only slightly.

Owing to the different expansion of the component in the active and inactive zones, mechanical stresses occur in the stack 1. Such stresses can lead to poling and/or relaxation cracks 25 in the stack 1.

FIG. 2a shows a detail of a stack 1 of piezoelectric layers 10 and inner electrodes 20, in which a crack 25 has been formed in the stack 1. The crack 25 extends parallel to the inner electrodes 20 inside the inactive zone, changes direction at the transition into the active zone and extends through neighboring inner electrodes 20 of different polarity in the active zone. This can lead to a short circuit of the inner electrodes 20.

Figure 2B:
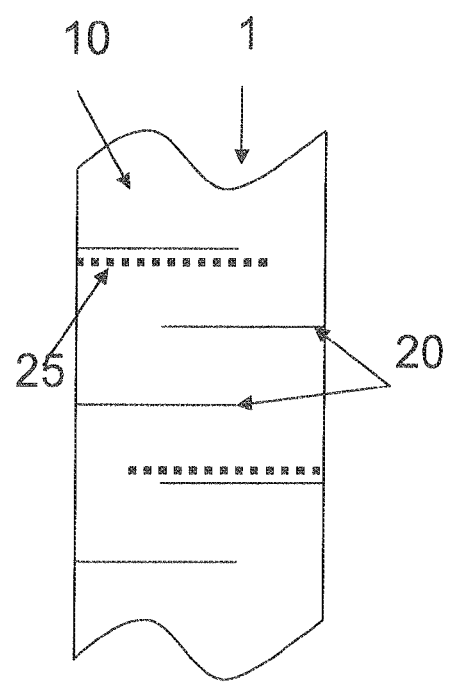
FIG. 2b shows another enlarged detail of the schematic side view of the multilayer component.

FIG. 2b shows a detail of a stack 1 of piezoelectric layers 10 and inner electrodes 20, in which a crack 25 has likewise been formed. Here, the crack 25 extends parallel to the inner electrodes 20. With such a profile of cracks 25, the risk of short circuits is reduced.

In order to promote such a profile of cracks 25, at least one layer of electrode material is provided with a PbO coating during the production of the multilayer component. The PbO may be applied in the form of PbO powder, $Pb_3O_4$ or another material containing PbO. Liquid forms of chemical compounds containing Pb are likewise possible. The grain size of the PbO may have a median value $d_{50}$ (the particle size distribution) of from 0.1 µm to 2 µm, preferably from 0.3 µm to 1.5 µm.

In addition or as an alternative, PbO may also be mixed with the electrode material. In this case, the PbO content relative to the sum of PbO and the other metals of the electrode material is up to 100 wt %, preferably up to 50 wt %.

A layer of electrode material may be provided with the coating or contain PbO; preferably, all layers may have a coating or contain PbO.

An intermediate phase, which contains $PbPdO_2$ and is spatially restricted to the region in which the PbO was present, is then formed during the sintering. Owing to the different volume and the different expansion behavior of this intermediate phase and of the contiguous piezoelectric layer, microcracks are formed in the region of the intermediate phase. After the conclusion of the sintering, when the $PbPdO_2$ has been reconverted, the region weakened by microcracks remains between the inner electrode and the piezoelectric layer. Relaxation and/or poling cracks, which are likewise spatially restricted, can then be formed from these microcracks. Branching of these cracks is thereby reduced or prevented.

Figure 3A:
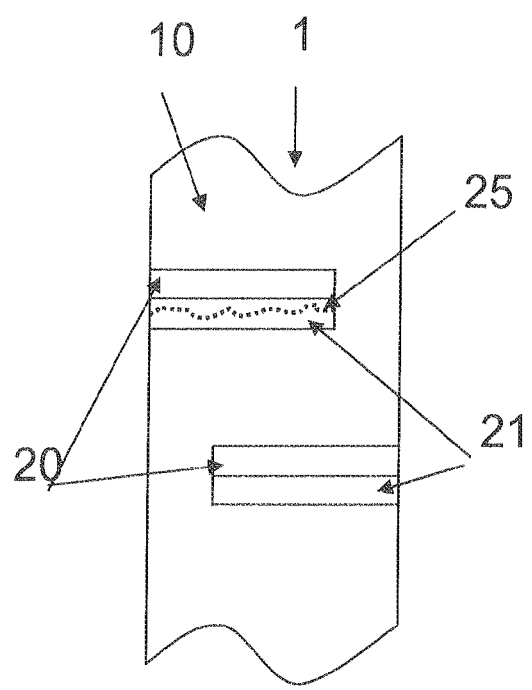
FIG. 3a shows another enlarged detail of the schematic side view of the multilayer component.

FIG. 3a shows another detail of a schematic side view of the multilayer component. Here again, a crack 25 has been formed along an inner electrode 20. The region 21, in which the crack is spatially restricted, is additionally shown.

This region 21 lies between the inner electrode 20 and the piezoelectric layer 10, specifically where the coating containing PbO was arranged on the electrode paste during the production method. In this region, the PbO reacted with the Pd from the electrode material to form $PbPdO_2$, and thereby formed the intermediate phase. Microcracks were able to form in the intermediate phase, as described above, and opened to form cracks during the polarization. The crack can only propagate in this region 21, so that it does not branch.

Figure 3B:
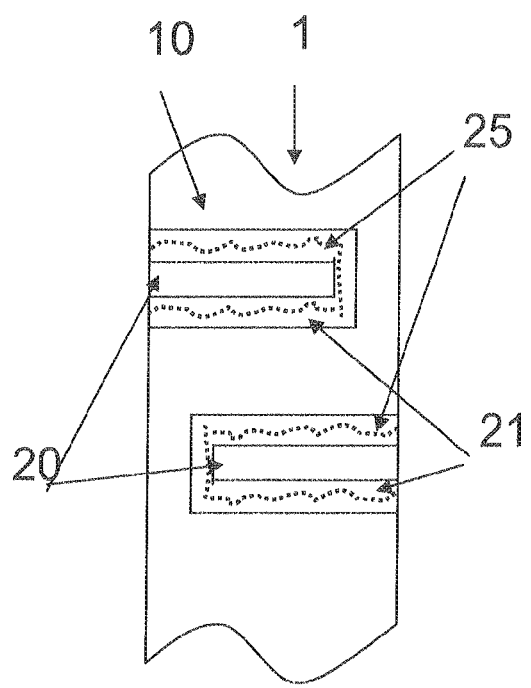
FIG. 3b shows another enlarged detail of the schematic side view of the multilayer component.

FIG. 3b shows a similar detail to FIG. 3a of a schematic side view of the multilayer component. Here, the cracks 25 extend around the inner electrodes 20. Such a distribution may occur above all when the PbO has been mixed with the electrode material, so that the region in which $PbPdO_2$ is formed occurs uniformly around the electrode layer.

A multilayer component produced in this way may contain pure lead zirconate titanate (PZT) or a PZT modified with dopants.

An example of a multilayer component comprises the piezoelectric layer 10 $(Pb_{1-x+a},Nd_x)((Zr_{1-z},Ti_z)_{1-y},Ni_y)O_3$ as PZT ceramic. In this case, the values may be $x=0.0001$ to $0.06$, $a=0$ to $0.05$, $z=0.35$ to $0.60$ and $y=0.0001$ to $0.06$. A PbO powder, which has a grain size of 1 μm, is used as a coating for the electrode layer. The inner electrodes contain Cu and Pd and a proportion by weight of PbO of from 10% to 50% in the electrode material. All electrode layers are printed with PbO for the production method.

By the description with the aid of the exemplary embodiments, the invention is not restricted thereto but covers any new feature and any combination of features. This in particular comprises any combination of features in the patent claims, even if this feature or this combination is not itself indicated explicitly in the patent claims or exemplary embodiments.

What is claimed is:

1. A piezoelectric multilayer component comprising:
a stack of sintered piezoelectric layers and inner electrodes arranged between the piezoelectric layers,
wherein a region that comprises cracks is present on a surface of at least one of the inner electrodes, and wherein the cracks are separated from a surface of at least one of the inner electrodes by the region comprising the cracks; and
wherein the region that comprises the cracks has at least one of a PbO content that is greater than a PbO content of the piezoelectric layers, and traces of $PbPdO_2$.

2. The multilayer component according to claim 1, wherein the cracks are substantially free of branching.

3. The multilayer component according to claim 1, wherein the inner electrodes comprise Pd.

4. The multilayer component according to claim 1, wherein the piezoelectric layers comprise lead zirconate titanate.

* * * * *